United States Patent [19]

Yamakawa et al.

[11] Patent Number: 5,275,878
[45] Date of Patent: Jan. 4, 1994

[54] COMPOSITE DIELECTRIC AND PRINTED-CIRCUIT USE SUBSTRATE UTILIZING THE SAME

[75] Inventors: Seishiro Yamakawa; Michimasa Tsuzaki; Kiyotaka Komori; Satoshi Fujiki; Akiyoshi Nozue, all of Kadoma; Kazunobu Abe; Masashi Aoki, both of Sakai, all of Japan

[73] Assignees: Matsushita Electric Works, Ltd.; Sakai Chemical Industry Co., Ltd., both of Osaka, Japan

[21] Appl. No.: 648,872

[22] Filed: Jan. 31, 1991

[30] Foreign Application Priority Data

Feb. 6, 1990 [JP] Japan .................................. 2-26906
Feb. 6, 1990 [JP] Japan .................................. 2-26907

[51] Int. Cl.$^5$ ............................................ C08F 23/00
[52] U.S. Cl. ............................... 428/306.6; 428/304.4; 428/314.2; 428/318.4; 428/319.3; 428/340; 525/534; 525/390; 528/219

[58] Field of Search .................. 428/930, 304.4, 306.6, 428/314.2, 318.4, 319.3, 340; 524/413; 252/518-520; 264/122; 361/321; 528/390, 219; 525/186, 60, 453, 534, 390

[56] References Cited

U.S. PATENT DOCUMENTS

| | | | |
|---|---|---|---|
| 4,227,111 | 10/1980 | Cross et al. | 310/358 |
| 4,330,593 | 5/1982 | Shrout et al. | 428/407 |
| 4,518,737 | 5/1985 | Traut | 524/413 |
| 4,686,409 | 8/1987 | Kaarmann et al. | 310/358 |
| 4,874,030 | 10/1989 | Kuphal et al. | 164/34 |
| 4,874,826 | 10/1989 | Sakamoto et al. | 525/534 |

Primary Examiner—Patrick J. Ryan
Assistant Examiner—Richard P. Weisberger
Attorney, Agent, or Firm—Burns, Doane, Swecker & Mathis

[57] ABSTRACT

A composite dielectric is formed with a matrix synthetic resin and particulate porous, inorganic dielectric dispersed in the matrix synthetic resin. The dielectric constant of this composite dielectric can be thereby elevated effectively without enlarging the dissipation factor (tan $\delta$) of the composite dielectric.

7 Claims, 1 Drawing Sheet

COMPOSITE DIELECTRIC AND PRINTED-CIRCUIT USE SUBSTRATE UTILIZING THE SAME

BACKGROUND OF THE INVENTION

This invention relates to a dielectric structure and, more particularly, to a composite dielectric and a printed-circuit use substrate utilizing the same.

The substrate for use in the printed circuits with the dielectric structure of this kind utilized should find its utility when employed in high frequency parts of communication equipments and the like.

DESCRIPTION OF RELATED ART

Generally, synthetic resins or ceramics have been employed as, for example, the dielectric for use in capacitors so as to be electronic circuit elements. When the synthetic resin is employed, polyphenylene oxide (PPO) known as a synthetic resin small in the dissipation factor (tan $\delta$) in high frequency range in particular has been attracting public attention as being high in the adaptability to recent modification of the electronic circuits for use with high frequencies. However, the synthetic resin of small tan $\delta$ has been involving a problem that the resin cannot be made sufficiently large in the dielectric constant ($\epsilon_r$).

In U.S. Pat. No. 4,518,737 of G. R. Traut, there has been disclosed a method for manufacturing a dielectric improved in the dielectric constant by mixing in a synthetic resin a filler comprising spherical ceramics of 1 to 20 $\mu$m and a fibrous material of a diameter less than 2 $\mu$m. In this case, there have been drawbacks that the dielectric constant for composite cannot be effectively elevated when the filler is added, and that a sedimenting separation of the filler is easily caused, and such subsequent working of the composite dielectric as cutting, perforation or the like is uneasy when the filler is of a large size.

In U.S. Pat. Nos. 4,227,111, No. 4,686,409 and No. 4,330,593 of L. E. Cross et al., there have been disclosed dielectrics made by having porous ceramics impregnated with synthetic resins so as to be high in the inorganic dielectric ratio with respect to the synthetic resin. These dielectrics according to the three U.S. patents have been developed as piezoelectric members, the dielectric constant of which is attempted to be rather lowered than to be elevated.

Accordingly, it has been demanded to provide a dielectric structure which can effectively elevate the dielectric constant ($\epsilon_r$) without enlarging the inorganic dielectric ratio, be made excellent in the dispersibility of the inorganic dielectric, and be made easier in being subjected to such subsequent working as the cutting, perforation or the like.

SUMMARY OF THE INVENTION

A primary object of the present invention is, therefore, to provide a composite dielectric structure which can effectively elevate the dielectric constant without enlarging the inorganic dielectric ratio, be made excellent in the dispersibility of the inorganic dielectric, and be made easier to be worked subsequently, and to provide a printed-circuit use substrate with such composite dielectric structure utilized.

According to the present invention, the above object can be realized by means of a composite dielectric in which a particulate inorganic dielectric is admixed within a matrix synthetic resin, characterized in that the inorganic dielectric is employed in the form of porous particles which are dispersed in the matrix synthetic resin.

Other objects and advantages of the present invention shall be made clear in the following description of the invention detailed with reference to respective embodiments of the invention.

Figure 1:
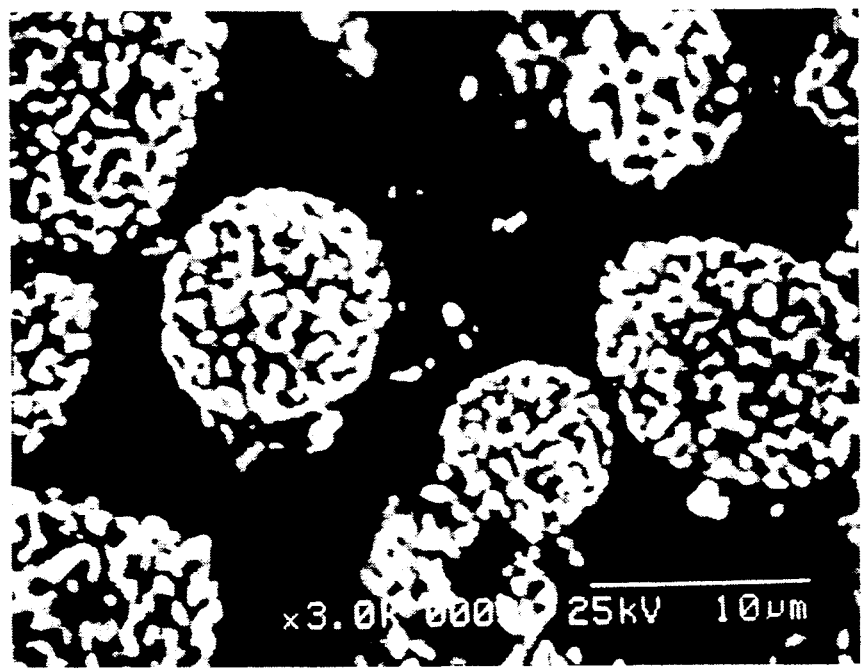
FIG. 1 is a scanning-type electron microscopicphotograph at 2500$\times$ magnification of the composite dielectric showing the state in which the particulate porous, inorganic dielectric is dispersed in the matrix synthetic resin.

While the present invention shall now be described in the followings with reference to the embodiments, it should be appreciated that its intention is not to limit the invention only to the embodiments described but is to rather include all modifications, alterations and equivalent arrangements possible within the scope of appended claims.

DETAILED DESCRIPTION OF THE PREFERRED EMBODIMENTS

In the present invention, particles of an inorganic dielectric are dispersed, without causing their sedimenting separation, within a synthetic resin preferably of a small dissipation factor (tan $\delta$), wherein particularly porous particles are used as the particulate inorganic dielectric in which many minute air spaces comprising pores, cracks and the like which are opened to particle surface are present so that the resin will enter into such air spaces.

For the particulate porous, inorganic dielectric, it is preferable to employ one having an average particle diameter of 5 to 100 $\mu$m and surface are of 0.3 to 7.0 m$^2$/g. Here, when the particle diameter exceeds 100 $\mu$m, the surface of the composite dielectric becomes uneven due to a coarseness of the particles so as to impair the smoothness, arise such tendency that the dielectric is deteriorated in the dissipation factor (tan $\delta$) due to a deterioration in the resistance to moisture and water, and that the dielectric characteristics are fluctuated due to easy crushing upon being molded. When the particle diameter is less than 5 m, there is seen a tendency that the elevation in the dielectric constant ($\epsilon_r$) becomes insufficient.

When, further, the specific surface area exceeds 7.0 m$^2$/g, the resistance to moisture and water is lowered to cause the dissipation factor (tan $\delta$) deteriorated, and the strength of particles is lowered for the easy crushing upon being molded and ready fluctuation in the dielectric characteristics, while, when the specific surface area is less than 0.3 m$^2$/g, the dielectric constant ($\epsilon_r$) shows the tendency of insufficient elevation.

Further, the particulate porous, inorganic dielectric may be in the form of secondary particles into which primary particles are agglomerated with the minute air spaces maintained, while the primary particles should preferably be mutually coupled physically and chemically by means of a sintering. It is further preferable that the particulate porous, inorganic dielectric consists of a compound of a high dielectric constant composition having a perovskite crystal structure.

For the synthetic resin used as the matrix, it may be possible to employ any one properly selected, while such resins of small dissipation factor (tan δ) in the high frequency as polyphenylene oxide (PPO) resin, fluoroplastic such as polyfluoroethylene resins including the one known as Teflon (Trademark of Du Pont), polycarbonate, polyethylene, polyethylene terephthalate, polypropylene, polystyrene and the like, for the resin to be used with the high frequency. These synthetic resins normally have a dielectric constant ($\epsilon_r$) of about 2.0 to 3.2. It is also possible to employ, as required, such resins as polyester, epoxy, polyfluorovinylidene PVDF of a large dielectric constant ($\epsilon_r$) and the like.

For the particulate porous, inorganic dielectric, in practice, there may be enumerated such inorganic compounds as $BaTiO_3$ compounds, $SrTiO_3$ compound $PbTi\frac{1}{2}Zr\frac{1}{2}O_3$ compounds, $Pb(Mg\ 2/3\ Nb\ \frac{1}{3})O_3$ compounds, $Ba(Sn_xMg_yTa_z)O_3$ compounds respectively having the perovskite crystal structure or a composite perovskite crystal structure, other single and composite compounds of $TiO_2$, $ZrO_2$ and $SnO_2$ and the like. The particulate porous, inorganic dielectric may be of such other shape that the spherical shape as various block piece shapes, while their configuration is not required to be specifically limited.

Further, the particulate porous, inorganic dielectric can be obtained by crushing blocks of an inorganic dielectric low in the sintered density and so formed as to be porous, or by sintering at a temperature about 1100° C. a particulate substance obtained by spraying in a dry atmosphere at, for example, about 130° C. a mixture fluid of such binder as PVA aqueous solution, preferable, in which an inorganic powdery material is dispersed (hereinafter referred to as a "spraying granulation"). In the latter case, the inorganic powdery material may be selected from ones of various particle diameter, while the sintering is performed in such that powder particles (primary) within respective particles (secondary) in the particulate substance obtained through the spraying are mutually physically ad chemically coupled through the sintering and the particles (secondary) of the particulate substance involve a particle growth in the case where the starting material is of fine powder particles but are mutually coupled to an extent of allowing the particles (secondary) to be mutually easily separable. The thus sintered particles are in possession of pores, cracks and the like opened to their surface to provide internal minute air spaces, so as to be porous.

In performing the sintering, in practice, sintering aids may be employed as required. For the sintering aids, any one can be ordinarily employed in sintering such particulate substance, while it is preferable that the aids are one which does not destroy the dielectric composition, nor impair its characteristics, but does provide a sufficient reinforcing effect. The amount in which the sintering aids are used may be properly selected in accordance with purposes and types, while it is normally desirable to use it in a range of 0.1 to 5 weight % with respect to the particulate inorganic dielectric. Further, while any sintering aids of a particle diameter in a range of 0.01 to 100 μm may be employed, it is desirable for a uniform dispersion that the diameter is in a range of about 0.1 to 5 μm. For the timing of adding the sintering aids, it may be optionally either at a stage of preparing the inorganic dielectric compound or at a stage of sintering the particulate substance. For example, the sintering aids may be dispersed in the binder at the same time as the dispersion of the inorganic powder into the binder.

In the event where the sintering aids are used, the sintering can be made easier than in the case where no aids are used, and it is additionally attained that the porous particles are improved in the strength so as to prevent the particulate porous, inorganic dielectric from being collapsed when the composite dielectric is formed, and that the particulate substance can be sintered at a relatively low temperature so as to render it possible to provide the porous particles which are high in the ratio of air space and to eventually elevate the dielectric constant ($\epsilon_r$) of the composite dielectric.

For the sintering aids, in practice, such borate, lead, bismuth, cadmium, lithium and the like glass as $BaO-SiO_2-B_2O_3$, $CaO-SiO_2-B_2O_3$, $Li_2O-SiO_2-B_2O_3$, $Li_2O-Al_2O_3-SiO_2$, $Na_2O-Al_2O_3-SiO_2$, $Li_2O-GeO_2$, $CdO-PbO-SiO_2$, $Li_2O-SiO_2$, $B_2O_3-Bi_2O_3$, $PbO-SiO_2-BaO$, $Na_2O-PbO-SiO_2$, $PbO-GeO_2$ and the like, such oxides as $CuO$, $Bi_2O_3$, $B_2O_3$, $CdO$, $Li_2O$, $PbO$, $WO_3$, $Pb_5Ge_3O_{11}$, $Li_2SiO_3$ and the like, and such fluoride as $LiF$, $CuF_2$, $ZnF_2$, $CaF_2$ and the like may be employed.

In sintering the particulate inorganic dielectric compound, it has been general that the particle growth or the electric characteristics of the sintered product is controlled by means of an action of an additive, and it may be also possible to employ in the present invention any one of various known additives for the same purposes.

While it is desirable that the particulate porous, inorganic dielectric is of the average particle diameter in the range of 5 to 100 μm and of the specific surface area in the range of 0.3 to 7.0 m²/g as has been described, it is desirable that, when the primary particles are agglomerated into the secondary particles, the primary particles be of a diameter in a range of about 0.1 to 5 μm. This requires to take into account that, when the particles employed are spherical, a relationship $$d \approx 6/(\rho \times Sw)$$

is satisfied between the particle diameter d of the primary particles, true specific gravity ρ of the primary particles and specific surface area Sw of the secondary particles. When barium titanate is employed, for example, as the particulate porous, inorganic dielectric, therefore, the primary particles of a particle diameter in a range of about 0.14 to 3.3 μm are employed.

In manufacturing the composite dielectric, it is possible to take up steps of crushing a dried and set material of, for example, a resin varnish in which the particulate porous, inorganic dielectric is dispersed, and molding the crushed material by means of a mold under conditions of heating and pressurizing. Composition ratio in the composite dielectric of the matrix synthetic resin and the particulate porous, inorganic dielectric is made to be, normally, 25 to 95 vol. % of the synthetic resin, preferably 50 to 80 vol. %, and 5 to 75 vol. % of the porous, inorganic dielectric, preferably 20 to 50 vol. %.

Examples embodying the present invention as in the foregoing shall be described in the following:

EXAMPLE 1

30 vol. % of porous $BaTiO_3$ particles of an average particle diameter of 20 μm and a specific surface area of 1.0 m²/g and 70 vol. % of PPO resin were metered, trichloroethylene of 1.5 times in volume as much as the above was added and they were agitated until PPO resin was completely dissolved, and a varnish was thereby obtained. Then, a dried and set material of this varnish was obtained, which was then crushed until unified to be less than 16 mesh. The crushed material was placed in a mold to be molded under conditions of a temperature of 250° C. and a pressure of 33 kg/cm$^2$ for 10 minutes, and composite dielectric of 1 mm thick and 8 mm in the diameter was obtained.

EXAMPLE 2

Except for the use of porous $BaTi_{0.7}Zr_{0.3}O_3$ particles of an average particle diameter of 15 μm and a specific surface area of 1.5 m$^2$/g, a composite dielectric was obtained in the same manner as in the above EXAMPLE 1.

EXAMPLE 3

Except for the use of porous $Ba_{0.8}Sr_{0.2}TiO_3$ particles of an average particle diameter of 25 μm and a specific surface area of 2.5 m$^2$/g, a composite dielectric was obtained in the same manner as in the above EXAMPLE 1.

EXAMPLE 4

Except for the use of porous $BaTi_{0.7}Zr_{0.3}O_3$ particles of an average particle diameter of 5 μm and a specific surface area of 5.2 m$^2$/g, a composite dielectric was obtained in the same manner as in the foregoing EXAMPLE 1.

EXAMPLE 5

Except for the use of porous $BaTi_{0.7}Zr_{0.3}O_3$ particles of an average particle diameter of 60 μm and a specific surface area of 1.8 m$^2$/g, a composite dielectric was obtained in the same manner as in the foregoing EXAMPLE 1.

EXAMPLE 6

Except for the use of porous $BaTi_{0.7}Zr_{0.3}O_3$ particles of an average particle diameter of 100 μm and a specific surface area of 2.1 m$^2$/g, a composite dielectric was obtained in the same manner as in the foregoing EXAMPLE 1.

EXAMPLE 7

Except for the use of porous $BaTi_{0.7}Zr_{0.3}O_3$ particles of an average particle diameter of 20 μm and a specific surface area of 0.5 m$^2$/g, a composite dielectric was obtained in the same manner as in the foregoing EXAMPLE 1.

EXAMPLE 8

Except for the use of porous $BaTi_{0.7}Zr_{0.3}O_3$ particles of an average particle diameter of 23 μm and a specific surface area of 6.8 m$^2$/g, a composite dielectric was obtained in the same manner as in the foregoing EXAMPLE 1.

COMPARATIVE EXAMPLE 1

Except for the use of non-porous $BaTi_{0.7}Zr_{0.3}O_3$ particles of an average particle diameter of 1.0 μm and a specific surface area of 1.8 m$^2$/g, a composite dielectric was obtained in the same manner as in the foregoing EXAMPLE 1.

COMPARATIVE EXAMPLE 2

Except for the use of non-porous $BaTi_{0.7}Zr_{0.3}O_3$ particles of an average particle diameter of 20 μm and a specific surface area of 0.2 m$^2$/g, a composite dielectric was obtained in the same manner as in the foregoing EXAMPLE 1.

Any one of such particulate porous, inorganic dielectric as used in the foregoing EXAMPLES 1 to 8 comprises secondary particles obtained through the foregoing spraying granulation from a starting material consisting of a calcined substance of an inorganic powder of an average particle diameter of 0.1 μm. In the present instance, the inorganic powder of 0.1 μm as the starting material has grown up to the primary particles of 1 μm.

With respect to both surfaces of the disk shaped composite dielectric plates obtained according to the foregoing EXAMPLES 1 to 8 and COMPARATIVE EXAMPLES 1 and 2, an acrylic Ag paste was applied and set to form electrodes thereon, and their dielectric characteristics were measured by means of an impedance analyzer, the results of which were as shown in a following Table I.

TABLE I

| | EXAMPLES | | | | | | | | COMP. EX. | |
|---|---|---|---|---|---|---|---|---|---|---|
| | 1 | 2 | 3 | 4 | 5 | 6 | 7 | 8 | 1 | 2 |
| Dielec. Constant($\epsilon_r$) (1 MHz) | 18.7 | 23.5 | 28.0 | 15.3 | 28.6 | 37.2 | 14.5 | 30.3 | 10.4 | 10.8 |
| Diss. Fact. tan δ (%) (1 MHz) | 0.32 | 0.33 | 0.35 | 0.31 | 0.36 | 0.48 | 0.28 | 0.40 | 0.31 | 0.30 |

As will be clear from the above Table I, it has been found that the composite dielectrics of the foregoing EXAMPLES 1 to 8 are all showing to have a sufficiently large dielectric constant ($\epsilon_r$) and also to be in a sufficiently unilizable range in respect of the dissipation factor (tan δ). It should be appreciated here, as will be made clear when the dielectric constant values of the composite dielectrics according to EXAMPLES 1 to 8 are compared with those of the composite dielectrics according to COMPARATIVE EXAMPLES 1 and 2, that the composite dielectric according to the present invention is remarkably elevated in the dielectric constant. In the case of the respective printed-circuit use substrates formed with the composite dielectrics of EXAMPLES 1 to 8 employed as the dielectric material, it has been found that they are excellent in such subsequent work as the cutting, perforation, bonding or the like, and that manufacturing costs could have been remarkably reduced.

Next, examples in which the particulate porous, inorganic dielectric obtained through the sintering with the sintering aid added is employed shall be described in the followings:

EXAMPLE 9

500 g of $BaTi_{0.7}Zr_{0.3}O_3$ powder of an average particle diameter 0.1 μm, 2.5 g of borosilicate glass (a product by Japanese firm IWAKI GLASS K. K.) and 50 ml of 5 wt. % polyvinyl alcohol solution were sufficiently wet-mixed within 1 lit. of ion exchange water, and thus obtained mixture was subjected to the spraying granulation, and thereafter to a heating treatment at 1050° C. for 2 hours, and a particulate porous, inorganic dielectric consisting of a plurality of primary particles was obtained. 30 vol. % of such porous $BaTi_{0.7}Zr_{0.3}O_3$ particles and 70 vol. % of PPO resin were metered, they were mixed as agitated with trichloroethylene of 1.5 times in volume as much as the above so as to have PPO resin completely solved, and a varnish was obtained. A dried and set material of this varnish was obtained next, which was then crushed and made uniformly to be less than 16 mesh, the crushed material was then placed in a mold and subjected to a pressure molding under conditions of a temperature of 250° C., a pressure of 33 kg/cm$^2$ and for 10 minutes, and thereby a composite dielectric was obtained in a plate shape of 1 mm thick and 8 mm in diameter.

800° C., a composite dielectric was obtained in the same manner as in the foregoing EXAMPLE 9.

At the stage where the porous, inorganic dielectric particles were obtained in the above EXAMPLES 9–17, the average particle diameter, specific surface area and average particle strength of these particulate substances as well as that obtained in the foregoing EXAMPLE 2 as a comparative sample were measured, results of which were as shown in a following Table II. In measuring the particle strength, a PCT strength tester manufactured by a Japanese firm SHIMADZU SEISAKUSHO K. K. was used. Further, acrylic Ag paste was applied to both surfaces of the composite dielectrics of EXAMPLES 9–17 and was set to form electodes thereon, and these composite dielectrics were subjected to a measurement of the dielectric characteristics by means of the impedance analyzer, results of which were as shown also in the following Table II, together with the measurements in the case of EXAMPLE 2 for comparison purpose.

TABLE II

| | EXAMPLES | | | | | | | | | |
|---|---|---|---|---|---|---|---|---|---|---|
| | 9 | 10 | 11 | 12 | 13 | 14 | 15 | 16 | 17 | 2 |
| Average Particle Diameter (μm) | 17 | 20 | 18 | 18 | 5 | 30 | 90 | 21 | 18 | 15 |
| Specif. Surf. Area (m$^2$/g) | 1.0 | 0.9 | 1.2 | 0.9 | 2.2 | 0.6 | 5.2 | 1.3 | 0.9 | 1.5 |
| Average Particle Strength (kg/mm$^2$) | 7.2 | 6.8 | 8.9 | 5.8 | 5.2 | 7.7 | 4.7 | 5.9 | 6.2 | 3.8 |
| Dielec. Const. $\epsilon_r$ | 21.0 | 19.8 | 17.3 | 20.2 | 20.3 | 20.1 | 27.2 | 18.8 | 17.0 | 23.5 |
| Diss. Fact. tan δ (%) | 0.33 | 0.41 | 0.49 | 0.38 | 0.36 | 0.30 | 0.42 | 0.41 | 0.30 | 0.33 |

EXAMPLE 10

Except for the use of $Ba_{0.7}Sr_{0.3}TiO_3$ powder of an average particle diameter of 0.1 μm, a composite dielectric was obtained in the same manner as in the above EXAMPLE 9.

EXAMPLE 11

Except for that the amount of borosilicate glass was made to be 5.0 g, a composite dielectric was obtained in the same manner as in the foregoing EXAMPLE 9.

EXAMPLE 12

Except for that the borosilicate glass was replaced by bismuth borate glass and the heat treating temperature was made 950° C., a composite dielectric was obtained in the same manner as in the foregoing EXAMPLE 9.

EXAMPLES 13–15

Except for that three types of the particulate substances different in the solid state properties were obtained with a variety of slurry concentration, spraying conditions and heat treating temperature, three different composite dielectrics were obtained in the same manner as in the foregoing EXAMPLE 9.

EXAMPLE 16

Except for that borosilicate glass was replaced by 1.7 g of CuO and the heat treating temperature was made 1000° C., a composite dielectric was obtained in the same manner as in the foregoing EXAMPLE 9.

EXAMPLE 17

Except for that borosilicate glass was replaced by 2.5 g of LiF and the heat treating temperature was made It has been found, as will be clear from the above Table II, that all of the composite dielectrics according to EXAMPLES 9–17 show sufficiently large dielectric constant ($\epsilon_r$) as well as sufficiently utilizable level of the dissipation factor (tan δ). It will be also appreciated that the particulate substances according to EXAMPLES 9–17, in comparison with that of EXAMPLE 2, have been remarkable improved in the particle strength without any substantial change in the dielectric constant ($\epsilon_r$) and dissipation factor (tan δ) for the composite dielectrics. It has been further found that the printed-circuit use substrates formed with the composite dielectrics of EXAMPLES 9–17 utilized as the dielectric material are excellent in such subsequent works as the cutting, perforation, bonding and the like. In addition, the manufacturing costs could have been also reduced remarkably.

According to one feature of the present invention, there can be provided a composite dielectric which has realized a higher dielectric constant ($\epsilon_r$) with a matrix PPO resin of a low dissipation factor (tan δ) and is also excellent in such solid state properties as the resistance to heat and chemicals, physical strength (rigidity) and so on and further in the dimensional stability. For realizing the feature, it is preferable that a composite dielectric is formed by having the matrix PPO resin made to contain crosslinking polymer and/or crosslinking monomer as well as the particulate porous, inorganic dielectric dispersed therein. The matrix may of course be of a single composition of the PPO resin.

For the particulate porous, inorganic dielectric in the present instance, it is possible to employ substantially the same ones employed in the foregoing EXAMPLES.

For the PPO resin itself to be employed here, it is preferable to employ such ones represented by a general formula as follows:

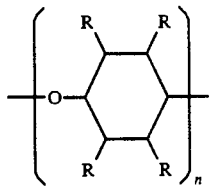

wherein R represents hydrocarbon radicals having hydrogen or carbon number of 1 to 3, and the respective radicals may be the same or different. An example of the PPO resins represented by this general formula is poly-(2,6-dimethyl-1,4-phenylene oxide). Such PPO resin may be synthesized by a process disclosed in, for example, U.S Pat. No. 4,059,568 and, while not required to be particularly limited, it will be possible to employ polymers having, for example, a weight-average molecular weight (Mw) of 50,000 and a molecular-weight distribution Mw/Mn=4.2 (Mn being a number-average molecular weight).

For the crosslinking polymer, for example, one or a mixture of at least two of 1,2-polybutadiene, 1,4-polybutadiene, styrene-polybutadiene copolymer, modified 1,2-polybutadiene (maleic-, acrylic- or epoxy-modification), rubbers and the like, while need not be limited to them. The polymer state may either be elastomer or rubber, while high-molecular weight rubber state is desirable from the viewpoint of improving the film forming property. In order to further improving the film forming property of the PPO resin, polystyrene may be added thereto to an extent of not hindering the desired object of the present invention.

For the crosslinking monomers, for example, such acrylates as ester acrylate, epoxy acrylate, urethane acrylate, ether acrylate, melamine acrylate, alkyd acrylate, silicon acrylate and the like; such polyfunctional monomers as triallyl cyanurate, triallyl isocyanurate, ethylene glycol dimethacrylate, divinylbenzene, diallyl phthalate and the like; such monofunctional monomers as vinyltoluene, ethyl vinyl benzene, styrene, paramethylstyrene and the like; and polyfunctional epoxies may be used respectively alone or in a mixture of two or more, while need not be limited to them. When the compatibility with the PPO resin, in the film-forming property, crosslinking property, resistance to heat and dielectric characteristics are taken into account, it is preferable to use triallyl cyanurate and/or triallyl isocyanurate.

Further, to the PPO resin composition, normally, an initiator is added. For the initiator, such peoxides as di-cumyl peroxide, tert-butyl cumyl peroxide, di-tert-butyl peroxide, 2,5-dimethyl-2,5-di-(tert-butyl- peroxy)-hexane, α,α'-bis(tert-butyl-peroxy-m-isopropyl) benzene or called 1,4(or 1,3)-bis(tert-butyl-peroxyisopropyl)benzene, BISCUMYL (a trademark of a Japanese firm NIPPON YUSHI K. K.) and the like may be employed respectively alone or in a mixture of two or more, while need not be limited to them.

Referring to the composition ratio of the PPO resin, crosslinking polymer and/or crosslinking monomer and initiator added as required, it is preferable that, with respect to a total amount of these raw materials, PPO resin is made to be more than 7 wt. %, crosslinking polymer and/or crosslinking monomer to be less than 93 wt. % and initiator to be 0.1 to 5 wt. %. When the materials are added out of the above range, the film-forming property is thereby deteriorated, and there arises a risk that such composite dielectric sheet as will be described later can no more be obtained. More desirable composition ratio of the materials will be, with respect to the total amount of the materials, PPO resin is made to be more than 7 wt. %, crosslinking polymer to be less than 93 wt. %, crosslinking monomer to be less than 70 wt. % and initiator to be 0.1 to 5 wt. %. More desirably, PPO resin is more than 10 wt. %, crosslinking polymer is less than 20 wt. %, crosslinking monomer is less than 60 wt. %, and initiator is in a range of 0.5 to 3 wt. %.

The raw materials in the above composition ratio are normally dissolved in a solvent to be subjected to a solution mixing, upon which it may be possible to employ a coupling agent according to any known process, so that the adherence between an inorganic filler and resin components will be made excellent and an eventual product will be made excellent in the solid state properties. In dissolving the materials into the solvent, it is preferable that the solid resin component of the PPO resin composition will be in a range of 10 to 30 wt. % with respect to the solvent. After the mixing, the solvent is removed, and the PPO resin composition can be obtained. For the solvent, there may be enumerated such halogenated hydrocarbon as trichloroethylene, trichloroethane, chloroform, methylene chloride and the like, such aromatic hydrocarbon as chlorobenzene, benzene, toluene, xylene and the like, acetone, carbon tetrachloride and the like, while it is preferable in particular to use trichloroethylene. They may be used alone or in a mixture of two or more, while need not be limited. For the mixing, it is not necessary to be limited to the solution mixing but any other measure can be employed.

Further, with the composite dielectric utilized, the dielectric having been obtained in such manner as in the above, there can be prepared a printed-circuit use substrate. In preparing such substrate, it is preferable to employ a reinforcement so as to render the substrate to be excellent in the mechanical strength or in the dimensional stability. As such reinforcement, any one in the form of cloth, mat and fiber which are made of either an inorganic or organic material may commonly be utilized, including cloth or mat shaped or fibrous glass material, alumina, zirconia or the like ceramic material, polyethylene, polyamide or the like organic material. When the material is in the cloth or mat shape, the one having a thickness of about 15 μm to 1.5 mm and a fiber diameter of about 0.5 to 20 μm is to be normally employed, while it is normal to employ, when the material is fiber, the one having a length of about 20 to 300 μm and a fiber diameter of about 2 to 50 μm.

In preparing the composite dielectric according to the present invention as has been described, it may be possible to employ a casting method which is more advantageous in the mass producibility. That is, the foregoing raw materials of the PPO resin composition are dissolved in a solvent and subjected to a solution mixing to obtain a mixture solution of the PPO resin composition and particulate porous, inorganic dielectric, which solution is formed into a thin layer as cast or applied over a proper base, the solvent is removed through a drying, and a composite dielectric can be obtained as a set material. According to this casting method, the set material having the PPO resin composition as the matrix can be formed within a low temperature atmosphere, without relying on any known calendering method which requires high costs. In the casting method, further, the set material is generally in the form of sheet, that is, film, while not required to be limited thereto, and the set material herein referred to should include a cured material.

Referring more specifically to the casting method, the sheet is obtained by casting or applying the mixture solution of the PPO resin composition and particulate porous, inorganic dielectric over a mirror finished iron plate or a casting carrier film to be of a thickness in a range of, for example 5 to 700 μm or preferably 5 to 500 μm, and drying sufficiently such cast solution to remove the solvent. The sheet herein referred to should include such various aspects as film, membrane, tape and the like, throughout which the expansion or length in a plane transversing at right angles the direction of thickness is not required to be particularly limited, and the thickness itself can be variously set in accordance with the intended use. For the casting carrier film, it is preferable to employ one of films made of polyethylene terephthalate (PET), polyethylene, polypropylene, polyimide and the like, which are preferably insoluble in the foregoing solvent and subjected to a releasing treatment, while not need be limited thereto. From the solution of the PPO resin composition cast or applied onto the casting carrier film, the solvent is removed by means of air-drying and/or hot-air drying. For the set temperature upon the drying, it is preferable that its upper limit is lower than the boiling temperature of the solvent and also lower than the heat resisting temperature of the carrier film specifically when the cast solution is dried as carried on the casting carrier film, and that its lower limit is determined on the basis of required drying time, treatability or the like, so that, when trichloroethylene is used as the solvent and PET film is employed as the casting carrier film, the drying temperature should preferably be in a range from room temperatures to 80° C., the drying at a higher part temperature in which range allows the required drying time to be shortened.

If a medium comprising a glass cloth impregnated with the mixture solution of the PPO resin composition and the particulate porous, inorganic dielectric (which medium shall be hereinafter referred to as "prepreg") is available, it is made easier to prepare a molded member (a laminate) which is excellent in the treatability and has any desired thickness attained by varying the thickness and/or the number of the prepregs. The prepreg may be prepared in various manners and, when the prepreg is to be prepared, the preparation can be easily performed at a relatively low temperature since the resin needs not be fused.

The printed-circuit use substrate according to the present invention may be prepared in such manner as will be described later, while not required to be limited thereto. The printed-circuit use substrate should include the laminate, as well as the ones having a metal foil on one or both surfaces and having no metal foil on any surface. In the case of the casting sheet, the same is sufficiently dried at a temperature lower than the decomposing temperature of the initiator added to the materials but higher than the boiling temperature of the solvent, so as to remove any remaining solvent. The laminate may be obtained by stacking a combination of a predetermined number of the sheets and/or of the prepregs prepared as in the above so as to be of a predetermined thickness designed, with the metal foil or foils also combined as required, and fusing the resin in the stacked combination under a heat and a pressure so as to fasten and bond the respective sheets mutually, the sheets to prepregs, the respective prepregs mutually, the sheet to the metal foils and the prepregs to the metal foils. While this fusion bonding allows a tight bonding to be attained, the bonding can be made more tight provided that a crosslinking reaction is caused to take place by the radical initiator due to the heating upon the fusing. The crosslinking reaction can be realized also by means of an irradiation of ultraviolet rays or of radioactive rays. As will be appreciated, the bonding excellent in the resistance to heat can be realized between the mutual sheets, the mutual prepregs, the sheets and the prepregs, the sheets and the metal foils and the prepregs and the metal foils.

In bonding the sheets and the prepregs as in the above, it is preferable to arrange them in the stacked combination to be symmetrical in vertical or thickness direction for attaining a prevention of any warpage from occurring after the molding or upon such secondary working as etching or the like, while needs not be limited thereto. From a viewpoint of an improvement in the bonding force, on the other hand, it is preferable to combine the sheets and metal foils so that the sheets will be positioned at bonding interfaces with respect to the metal foils. For the bonding between the metal foils and the sheets, the thermal fusion of the sheets can be utilized, upon which the pressurizing temperature should preferably be above the glass transition temperature of the sheet and generally in a range of about 160° to 300° C. In the case of the cured material of the PPO resin composition and the particulate porous, inorganic dielectric, a slight amount of the resin is caused to flow prior to the curation and the composition shows particularly an excellent fusion bonding ability with respect to the metal foil, while an adhesive agent may be concurrently used.

As the metal foil, it is possible to use copper foil, aluminum foil or the like. The fastening under the pressure is performed for the bonding between the mutual sheets, the sheets and the prepregs, the mutual prepregs, the metal foils and the sheets, the metal foils and the prepregs and so on, and for adjusting the thickness of the laminate, the conditions for which are to be properly selected while it is required to pay attention so as not to compressingly crush the inorganic filler. When the crosslinking is performed by means of the heating, the crosslinking reaction is to rely on reaction temperature and so on of the initiator to be used, and the heating temperature is set in accordance with the type of the initiator. It may be possible to set, for example, the temperature in a range of 150° to 300° C., the pressure to be 30 kg/cm$^2$, and the time to be in a range of about 10 to 60 minutes, while not required to be limited thereto. Further, it may be also possible to have a predetermined number of the sheets and/or prepregs molded as stacked and heated preliminarily, and to have the metal foils stacked on one or both surfaces of the molded stack to be joined therewith under the heat and pressure to be fastened together. Generally, the printed-circuit use substrate is to have a thickness of about 0.1 to 2 mm.

Further, the set material prepared in the foregoing manner with the PPO resin composition and the particulate porous, inorganic dielectric can be made high in the tensile strength, impact strength, burst strength, resistance to heat and so on, by means of the thermal, photo-, irradiation or the like crosslinking executed with the radical initiator employed.

It will be appreciated that the composite dielectric and the printed-circuit use substrate obtained in the foregoing manner maintain a low dissipation factor (tan $\delta$) which is the characteristic of PPO, and are excellent in such various solid state properties as the high frequency characteristics, resistance to heat and so on and also in the dimensional stability, while still being easily manufacturable.

EXAMPLE 18

30 vol. % of porous $BaTiO_3$ particles of an average particle diameter 20 $\mu$m and specific surface area 1.0 $m^2/g$ and 70 vol. % of the PPO resin were metered and mixed with trichloroethylene of 1.5 times in volume as much as the above, their mixture was agitated to have the PPO resin completely dissolved, and a varnish was thereby obtained. A plain weave glass cloth (woven to be 100 $\mu$m thick with glass fibers of diameter 7 $\mu$m at weave density of 60 warps and 58 wefts per 25 mm) was impregnated with the varnish, the latter of which was dried at 50° C. In the thus obtained varnish-impregnated glass cloth, the ratio occupied by the resin and $BaTiO_3$ was 73 wt. % (about 70 vol. %). Five sheets of the thus obtained varnish-impregnated glass cloths were stacked, copper foils of each 17 $\mu$m thick were disposed at top and bottom of the stacked cloths, they were pressure-molded under molding conditions of a temperature of 250° C. and a pressure of 33 kg/cm² for 10 minutes, and a both-surface copper clad substrate for the printed-circuit use was obtained.

EXAMPLE 19

Except for the use of porous $BaTi_{0.7}Zr_{0.3}O_3$ particles of an average particle diameter of 15 $\mu$m and a specific surface area of 1.5 $m^2/g$, a printed-circuit use substrate was obtained in the same manner as in EXAMPLE 18. In the used varnish-impregnated glass cloth the occupying ratio of the total amount of the resin and porous inorganic dielectric particles was 72 wt. % (about 70 vol. %).

EXAMPLE 20

Except for the use of porous $Ba_{0.8}Sr_{0.2}TiO_3$ particles of an average particle diameter of 25 $\mu$m and a specific surface area of 2.5 $m^2/g$, a printed-circuit use substrate was obtained in the same manner as in EXAMPLE 18. In the used varnish-impregnated glass cloth the occupying ratio of the total amount of the resin and porous inorganic dielectric particles was 72 wt. % (about 70 vol. %).

EXAMPLE 21

Except for the use of porous $BaTi_{0.7}Zr_{0.3}O_3$ particles of an average particle diameter of 5 $\mu$m and a specific surface area of 5.2 $m^2/g$, a printed-circuit use substrate was obtained in the same manner as in EXAMPLE 18. In the used varnish-impregnated glass cloth the occupying ratio of the total amount of the resin and porous inorganic dielectric particles was 73 wt. % (about 70 vol. %).

EXAMPLE 22

Except for the use of porous $BaTi_{0.7}Zr_{0.3}O_3$ particles of an average particle diameter of 60 $\mu$m and a specific surface area of 1.8 $m^2/g$, a printed-circuit use substrate was obtained in the same manner as in EXAMPLE 18. In the used varnish-impregnated glass cloth the occupying ratio of the total amount of the resin and porous inorganic dielectric particles was 73 wt. %(about 70 vol. %).

EXAMPLE 23

Except for the use of porous $BaTi_{0.7}Zr_{0.3}O_3$ particles of an average particle diameter of 100 $\mu$m and a specific surface area of 2.1 $m^2/g$, a printed-circuit use substrate was obtained in the same manner as in EXAMPLE 18. In the used varnish-impregnated glass cloth the occupying ratio of the total amount of the resin and porous inorganic dielectric particles was 72 wt. % (about 70 vol. %).

EXAMPLE 24

Except for the use of porous $BaTi_{0.7}Zr_{0.3}O_3$ particles of an average particle diameter of 20 $\mu$m and a specific surface area of 0.5 $m^2/g$, a printed-circuit use substrate was obtained in the same manner as in EXAMPLE 18. In the used varnish-impregnated glass cloth the occupying ratio of the total amount of the resin and porous inorganic dielectric particles was 72 wt. % (about 70 vol. %).

EXAMPLE 25

Except for the use of porous $BaTi_{0.7}Zr_{0.3}O_3$ particles of an average particle diameter of 23 $\mu$m and a specific surface area of 6.8 $m^2/g$, a printed-circuit use substrate was obtained in the same manner as in EXAMPLE 18. In the used varnish-impregnated glass cloth the occupying ratio of the total amount of the resin and porous inorganic dielectric particles was 73 wt. % (about 70 vol. %).

COMPARATIVE EXAMPLE 3

Except for the use of non-porous $BaTi_{0.7}Zr_{0.3}O_3$ particles of an average particle diameter of 1.0 $\mu$m and a specific surface area of 1.8 $m^2/g$, a printed-circuit use substrate was obtained in the same manner as in EXAMPLE 8. In the used varnish-impregnated glass cloth the occupying ratio of the total amount of the resin and non-porous inorganic dielectric particles was 73 wt. % (about 70 vol. %).

COMPARATIVE EXAMPLE 4

Except for the use of non-porous $BaTi_{0.7}Zr_{0.3}O_3$ particles of an average particle diameter of 20 $\mu$m and a specific surface area of 0.2 $m^2/g$, a printed-circuit use substrate was obtained in the same manner as in EXAMPLE 18. In the used varnish-impregnated glass cloth the occupying ratio of the total amount of the resin and non-porous inorganic dielectric particles was 73 wt. % (about 70 vol. %).

The respective particulate porous, inorganic dielectrics employed in the foregoing EXAMPLES 18 to 25 comprise the secondary particles obtained through the foregoing spraying granulation from a calcined inorganic powder of an average particle diameter of 0.1 $\mu$m as a starting material, in which the calcined powder material of the average particle diameter of 0.1 $\mu$m grows to the primary particles of about 1 $\mu$m.

With respect to the respective printed-circuit use substrates of the foregoing EXAMPLES 18 to 25 as well as COMPARATIVE EXAMPLES 3 and 4, the dielectric constant ($\epsilon_r$) and dissipation factor (tan $\delta$) were measured with the impedance analyzer employed, results of which were as shown in a following TABLE III:

TABLE III

| | EXAMPLES | | | | | | | | COMP. EX. | |
|---|---|---|---|---|---|---|---|---|---|---|
| | 18 | 19 | 20 | 21 | 22 | 23 | 24 | 25 | 3 | 4 |
| Dielec. Constant $\epsilon_r$ (1 MHz) | 14.6 | 18.1 | 20.2 | 12.1 | 20.3 | 23.8 | 12.0 | 20.7 | 9.0 | 9.1 |
| Diss. Fact. tan δ (%) (1 MHz) | 0.31 | 0.32 | 0.33 | 0.30 | 0.35 | 0.38 | 0.30 | 0.35 | 0.28 | 0.27 |

As will be clear from the above TABLE III, the respective printed-circuit use substrates according to EXAMPLES 18 to 25 show to have the dielectric constant ($\epsilon_r$) of more than about 10 which is proper for use as the substrate, and their dissipation factor (tan δ) are also in a sufficiently utilizable range. Further, as will be clear when the measurement of EXAMPLES 18 to 25 is compared with that of COMPARATIVE EXAMPLES 3 and 4, the printed-circuit use substrates according to the present invention are remarkably elevated in the dielectric constant. Further, the printed-circuit use substrates of EXAMPLES 18 to 25 have been proved to be excellent in respect of the subsequent working and to be capable of remarkably reducing the manufacturing costs.

Next, the printed-circuit use substrates have been obtained with a use of a particulate porous, inorganic dielectric obtained through a sintering with a sintering aid added, examples of which are as follows:

EXAMPLE 26

500 g of $BaTi_{0.7}Zr_{0.3}O_3$ powder of an average particle diameter of 0.1 μm, 2.5 g of borosilicate glass (the product by IWAKI GLASS K. K.) and 50 ml of 5 wt. % polyvinyl alcohol solution were sufficiently wet-mixed within 1 lit. of ion-exchange water, a resultant mixture of which was then subjected to the spraying granulation. Through a heat-treatment at 1050° C. for 2 hours, the granulated mixture was made into a particulate material of porous, inorganic dielectric particles respective which comprise a plurality of the primary particles, the material thus being the secondary particles. Next, 30 vol. % of such porous $BaTi_{0.7}Zr_{0.3}O_3$ particles and 70 vol. % of PPO resin were metered, they were agitated with trichloroethylene of 1.5 times in volume as much as the above to have the PPO resin dissolved completely, and a varnish was obtained. A plain weave glass cloth (woven to be 100 μm thick with glass fibers of 7 μm at weave density of 60 warps and 58 wefts per 25 mm) was impregnated with this varnish, the latter of which was then dried at 50° C. The occupying ratio of the total amount of the resin and particulate porous, inorganic dielectric in the thus obtained varnish-impregnated glass cloth was 73 wt. % (about 70 vol. %). Five sheets of the thus obtained varnish-impregnated glass cloths were stacked, copper foils of each 17 μm thick were disposed at top and bottom of the stacked cloths, they were pressure-molded under molding conditions of a temperature 250° C. and a pressure of 33 kg/mm² for 10 minutes, and a both-surface copper clad substrate for the printed-circuit use was obtained.

EXAMPLE 27

Except for the use of $Ba_{0.7}Sr_{0.3}TiO_3$ powder of an average particle diameter of 0.1 μm, a printed-circuit use substrate was obtained in the same manner as in EXAMPLE 26. The occupying ratio of the total amount of the resin and particulate porous, inorganic dielectric in the used varnish-impregnated glass cloth was 73 wt. % (about 70 vol. %).

EXAMPLE 28

Except for that the amount of borosilicate glass was made to be 5.0 g, a printed-circuit use substrate was obtained in the same manner as in EXAMPLE 26. The occupying ratio of the total amount of the resin and particulate porous, inorganic dielectric in the used varnish-impregnated glass cloth was 73 wt. % (about 70 vol. %).

EXAMPLE 29

Except for that the borosilicate glass was replaced by a bismuth borate glass and the heat treating temperature was made 950° C., a printed-circuit use substrate was obtained in the same manner as in the EXAMPLE 26. The occupying ratio of the total amount of the resin and particulate porous, inorganic dielectric in the used varnish-impregnated glass cloth was 73 wt. % (about 70 vol. %).

EXAMPLES 30–32

Three types particulate materials different in the solid state properties were obtained by varying slurry concentration, spraying conditions and heat-treating temperature in the foregoing EXAMPLE 26, and three different printed-circuit use substrates were obtained with such different particulate materials employed. In the used varnish-impregnated glass cloths, the occupying ratio of the total amount of the resin and particulate porous, inorganic dielectric was 73 wt. % (about 70 vol. %).

EXAMPLE 33

Except for that borosilicate glass in EXAMPLE 26 was replaced by 1.7 g of CuO and the heat treating temperature was made to be 1000° C., a printed-circuit use substrate was obtained in the same manner as in EXAMPLE 26. In the used varnish-impregnated glass cloth, the occupying ratio of the total amount of the resin and particulate porous, inorganic dielectric was 72 wt. % (about 70 vol. %).

EXAMPLE 34

Except for that the borosilicate glass in EXAMPLE 26 was replaced by 2.5 g of LiF and the heat treating temperature was made 800° C., a printed-circuit use substrate was obtained in the same manner as in EXAMPLE 26. The occupying ratio of the total amount of the resin and particulate porous, inorganic dielectric in the used varnish-impregnated glass cloth was 72 wt. % (about 70 vol. %).

At the stage where the particulate porous, inorganic dielectric were obtained in these EXAMPLES 26–34 as well as in the foregoing EXAMPLE 19 as a comparative example, their average particle diameter, specific surface area and average particle strength were measured, results of which measurement were as shown in a following TABLE IV, in which the measurement of the particle strength was made with the foregoing PCT strength tester. The respective printed-circuit use substrates of these EXAMPLES were also subjected to the measurement of the dielectric characteristics with the impedance analyzer employed, results of which were as shown also in the TABLE IV which showing concurrently the measurement in respect of EXAMPLE 19 for comparison purpose.

TABLE IV

| | EXAMPLES | | | | | | | | | |
|---|---|---|---|---|---|---|---|---|---|---|
| | 26 | 27 | 28 | 29 | 30 | 31 | 32 | 33 | 34 | 19 |
| Average Particle Diameter ($\mu$m) | 17 | 20 | 18 | 18 | 5 | 30 | 90 | 21 | 18 | 15 |
| Specif. Surf. Area (m$^2$/g) | 1.0 | 0.9 | 1.2 | 0.9 | 2.2 | 0.6 | 5.2 | 1.3 | 0.9 | 1.5 |
| Average Particle Strength (kg/mm$^2$) | 7.2 | 6.8 | 8.9 | 5.8 | 5.2 | 7.7 | 4.7 | 5.9 | 6.2 | 3.8 |
| Dielec. Const. $\epsilon_r$ (1 MHz) | 16.5 | 15.8 | 13.7 | 16.2 | 16.2 | 16.2 | 21.0 | 15.1 | 13.5 | 18.1 |
| Diss. Fact. tan $\delta$ (%) (1 MHz) | 0.33 | 0.32 | 0.30 | 0.32 | 0.32 | 0.31 | 0.35 | 0.32 | 0.32 | 0.32 |

As will be clear from the above TABLE IV, the respective printed-circuit use substrates of EXAMPLES 26-34 have shown sufficiently large dielectric constant ($\epsilon_r$) and also the dissipation factor (tan $\delta$) sufficiently in the utilizable range. It will be appreciated that, as will be clear when compared with the measurement of EXAMPLE 19, the substrates of EXAMPLES 26-34 have been remarkably improved in the particle strength without any substantial change in the dielectric constant ($\epsilon_r$) and dissipation factor (tan $\delta$).

Further, the printed-circuit use substrates were obtained by using a PPO resin composition in which the crosslinking was caused to take place by a crosslinking agent added to the PPO resin, examples of which were as in the followings.

EXAMPLES 35-40

Except for that the PPO resin compositions of such raw materials as shown in a following TABLE V were employed and the molding was performed under molding conditions of 200° C. and for 30 minutes, the both-surface copper clad printed-circuit use substrates were obtained in the same manner as in EXAMPLE 26. Upon the molding, there were taken place the thermal fusion and crosslinking concurrently. In the used varnish-impregnated glass cloths, the occupying ratio of the total amount of the resin and particulate porous, inorganic dielectric was 73 wt. % (about 70 vol. %). Further, in the mixture of the PPO resin and particulate porous, inorganic dielectric, the ratio occupied by the particles was about 30 vol. %.

TABLE V (Unit: parts by weight)

| | EXAMPLE | | | | | |
|---|---|---|---|---|---|---|
| | 35 | 36 | 37 | 38 | 39 | 40 |
| PPO | 110 | 40 | 110 | 40 | 110 | 110 |
| Crosslinking Polymer | SBS 80 | SBS 120 | SBS 80 | SBS 120 | p-TAIC 90 | — |
| Crosslinking Monomer | TAIC 10 | TAIC 40 | TAIC 10 | TAIC 40 | — | TAIC 90 |
| Initiator | A 4 | A 4 | A 4 | A 4 | A 4 | A 4 |
| Porous Inorg. Dielectric | 470 | 470 | 470 | 470 | 470 | 470 |
| Solvent (trichloro-ethylene) | 1000 | 1000 | 1000 | 1000 | 1000 | 1000 |

In TABLE V, SBS denotes styrene-butadiene copolymer, TAIC is triallyl isocyanurate, p-TAIC is a polymer of TAIC, and A represents 2,5-dimethyl-2,5-di-(tert-butylperoxy)hexylne-3. For this A, PERHEXYNE-25B made by a Japanese firm NIPPON YUSHI K. K. was used.

COMPARATIVE EXAMPLE 5

The same porous BaTi$_{0.7}$Zr$_{0.3}$O$_3$ particles as that in EXAMPLE 26 was used as the particulate porous, inorganic dielectric, and FR-4 epoxy glass laminate CCL was prepared. In this case, the volume ratio of the resin and particles was made 70:30, and also the volume ratio of a mixture of the resin and particles with respect to the glass cloth was made 70:30.

COMPARATIVE EXAMPLE 6

Except for the use of non-porous BaTi$_{0.7}$Zr$_{0.3}$O$_3$ particles of an average particle diameter of 1 $\mu$m and a specific surface area of 1.8 m$^2$/g, a both-surface copper-clad printed-circuit use substrate was obtained in the same manner as in EXAMPLE 35.

With respect to the respective substrates of EXAMPLES 35-40 and COMPARATIVE EXAMPLES 5 and 6, the measurement of the dielectric constant ($\epsilon_r$), dissipation factor (tan $\delta$), peeling strength and resistance to soldering heat was executed, results of which were as shown in following TABLE VI which showing also relevant data on the substrate of EXAMPLE 26 for comparison purpose.

TABLE VI

| | EXAMPLE | | | | | | | COMP. EX. | |
|---|---|---|---|---|---|---|---|---|---|
| | 35 | 36 | 37 | 38 | 39 | 40 | 26 | 5 | 6 |
| Dielec. Const. $\epsilon_r$ (1 MHz) | 16.0 | 15.6 | 16.2 | 16.2 | 16.5 | 16.3 | 16.5 | 17.0 | 9.0 |
| Diss. Fact. tan $\delta$ (%) (1 MHz) | 0.32 | 0.31 | 0.30 | 0.30 | 0.31 | 0.34 | 0.33 | 2.2 | 0.28 |
| Peeling Strength | 2.1 | 2.0 | 2.0 | 2.3 | 2.4 | 2.3 | 2.3 | 2.0 | 2.4 |

TABLE VI-continued

| | EXAMPLE | | | | | | | COMP. EX. | |
|---|---|---|---|---|---|---|---|---|---|
| | 35 | 36 | 37 | 38 | 39 | 40 | 26 | 5 | 6 |
| (kg/cm) Resist. to Sold'g | above 60 | above 60 | above 60 | above 60 | above 60 | above 60 | 25 | above 60 | above 60 |
| Heat sec. (260° C.) | | | | | | | | | |

As will be clear from the above TABLE VI, the printed-circuit use substrates of EXAMPLES 35-40 and 26 in which the PPO resin composition and particulate porous, inorganic dielectric are used show respectively a larger dielectric constant ($\epsilon_r$) than that of the printed-circuit use substrate of COMPARATIVE EXAMPLE 6 in which the non-porous inorganic dielectric particles are used, as well as a sufficiently smaller dissipation factor (tan $\delta$) enough to be in utilizable range than that of the substrate of COMPARATIVE EXAMPLE 5 in which no PPO resin is used., Further, since the printed-circuit use substrates of EXAMPLES 35-40 are made with the PPO resin composition crosslinked by means of the crosslinking agent, they are excellent in the resistance to heat in contrast to the one of, for instance, EXAMPLE 26 which involves no crosslinking. In view of these respects, it will be appreciated that the composite dielectric employed in the printed-circuit use substrate according to the present invention is excellent. Further, the printed-circuit use substrates according to EXAMPLES 35-40 have been of course improved remarkably in respect of such subsequent working as the cutting, perforation, bonding and the like, so that the yield of production can be remarkably improved while remarkably reducing the manufacturing costs.

For the particulate porous, inorganic dielectric employed in the foregoing EXAMPLES 35-40, borosilicate glass was added as the sintering aid and the dielectric was sintered. The effect is excellent as described in the foregoing.

What is claimed is:

1. A composite dielectric comprising a matrix synthetic resin, and a particulate porous, inorganic dielectric dispersed in said matrix synthetic resin, said particulate porous, inorganic dielectric comprising secondary particles formed by agglomerating primary particles which are sintered to be mutually coupled, and having an average particle diameter of 5 to 100 μm and a specific surface area of 0.3 to 7.0 m²/g.

2. The composite dielectric of claim 1, wherein said secondary particles are formed by sintering with a sintering aid.

3. The composite dielectric of claim 1, wherein said particulate porous, inorganic dielectric comprises a compound having a perovskite crystal structure.

4. The composite dielectric of claim 1, wherein said matrix synthetic resin comprises polyphenylene oxide and a crosslinking polymer or a crosslinking monomer.

5. The composite dielectric of claim 4, wherein polyphenylene oxide comprises more than 7 wt. % of said composite dielectric.

6. The composite dielectric of claim 5, wherein said crosslinking polymer is selected from the group consisting of 1,2-polybutadiene, 1,4-polybutadiene, styrene-butadiene copolymer, modified 1,2-polybutadiene, rubbers and combinations thereof.

7. The composite dielectric of claim 5, wherein said crosslinking monomer is selected from the group consisting of ester acrylates, epoxy acrylates, urethane acrylates, ether acrylates, melamine acrylates, alkyd acrylates, silicon acrylates, triallyl cyanurate, triallyl isocyanurate, ethylene glycol dimethacrylate, divinylbenzene, diallyl phthalate, vinyltoluene, ethyl vinyl benzene, styrene, paramethylstyrene, polyvinylfunctional epoxies and mixtures thereof.

* * * * *